United States Patent
Ngion et al.

(10) Patent No.: US 10,654,709 B1
(45) Date of Patent: May 19, 2020

(54) SHIELDED SEMICONDUCTOR DEVICE AND LEAD FRAME THEREFOR

(71) Applicant: NXP USA, INC., Austin, TX (US)

(72) Inventors: Lee Fee Ngion, Melaka (MY); Zi-Song Poh, Melaka (MY); Michael B. Vincent, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/174,299

(22) Filed: Oct. 30, 2018

(51) Int. Cl.
*H01L 29/84* (2006.01)
*B81B 7/00* (2006.01)
*B81C 1/00* (2006.01)
*G01L 9/00* (2006.01)

(52) U.S. Cl.
CPC .......... *B81B 7/0064* (2013.01); *B81B 7/007* (2013.01); *B81B 7/0061* (2013.01); *B81C 1/00301* (2013.01); *B81C 1/00309* (2013.01); *G01L 9/0042* (2013.01); *B81B 2201/0264* (2013.01); *B81B 2207/012* (2013.01); *B81B 2207/098* (2013.01); *B81C 2203/0154* (2013.01); *B81C 2203/0792* (2013.01)

(58) Field of Classification Search
CPC . H01L 23/367; H01L 23/3677; B81B 7/0064; B81B 7/0061
See application file for complete search history.

(56) References Cited

U.S. PATENT DOCUMENTS

| | | |
|---|---|---|
| 5,166,772 A | 11/1992 | Soldner et al. |
| 5,557,142 A | 9/1996 | Gilmore et al. |
| 5,744,827 A | 4/1998 | Jeong et al. |
| 6,740,959 B2 | 5/2004 | Alcoe et al. |
| 7,449,775 B1 * | 11/2008 | Ankireddi ........... H01L 23/4006 257/712 |
| 7,781,266 B2 | 8/2010 | Zhao et al. |
| 8,138,584 B2 | 3/2012 | Wang et al. |
| 9,153,543 B1 | 10/2015 | Mangrum et al. |
| 9,362,209 B1 | 6/2016 | Mangrum |
| 2007/0071268 A1 | 3/2007 | Harney et al. |
| 2007/0164409 A1 | 7/2007 | Holland |
| 2008/0014678 A1 | 1/2008 | Howard et al. |
| 2008/0197485 A1 | 8/2008 | Theuss et al. |
| 2009/0184403 A1 | 7/2009 | Wang et al. |
| 2009/0289335 A1 | 11/2009 | Camacho et al. |
| 2009/0302483 A1 * | 12/2009 | Lin ................... H01L 23/49575 257/777 |
| 2011/0049685 A1 | 3/2011 | Park et al. |
| 2011/0089547 A1 * | 4/2011 | Holloway ............. H01L 21/568 257/676 |

(Continued)

*Primary Examiner* — Phuc T Dang

(74) *Attorney, Agent, or Firm* — Charlene R. Jacobsen

(57) ABSTRACT

A shielded semiconductor device is assembled using a lead frame having a die receiving area, leads disposed around the die receiving area, and a bendable strip formed in the die receiving area. Each lead has an inner lead end that is spaced from but near to one of the sides of the die receiving area and an outer lead end that is distal to that side of the die receiving area. An IC die is attached to the die receiving area and electrically connected to the inner lead ends of the leads. An encapsulant is formed over the die and the electrical connections and forms a body. The strip is bent to extend vertically to a top side of the body. A lid is formed on the top side of the body and is in contact with a distal end of the vertical strip.

20 Claims, 3 Drawing Sheets

(56) References Cited

U.S. PATENT DOCUMENTS

| | | |
|---|---|---|
| 2012/0126378 A1 | 5/2012 | San Antonio et al. |
| 2014/0203380 A1* | 7/2014 | Theuss .................. B81B 3/0021 |
| | | 257/416 |
| 2015/0001646 A1 | 1/2015 | Mueller et al. |
| 2016/0130137 A1* | 5/2016 | Huang ...................... B81B 7/02 |
| | | 257/415 |
| 2016/0172309 A1 | 6/2016 | Gong et al. |
| 2017/0025369 A1 | 1/2017 | Gulpen et al. |
| 2017/0103937 A1* | 4/2017 | Hsieh .................... H01L 25/105 |
| 2017/0278825 A1* | 9/2017 | Lakhera ............ H01L 23/49575 |
| 2019/0259717 A1* | 8/2019 | Dadvand ................. H01L 24/03 |

* cited by examiner

SHIELDED SEMICONDUCTOR DEVICE AND LEAD FRAME THEREFOR

BACKGROUND

The present invention relates generally to semiconductor devices and semiconductor device packaging and, more particularly, to semiconductor device packages with electromagnetic interference shielding.

Semiconductor device packages or integrated circuit chip carriers are used in many high-density electronics applications. The integrated circuits or semiconductor devices are protected from the external environment by encapsulation with an epoxy material or transfer molding a thermoplastic resin about the device. However, as circuits become smaller, denser, and operate at higher frequencies and in harsher environments, there is a growing need to shield the circuits from radiation, such as radio frequency interference (RFI) and electromagnetic interference (EMI). For example, cell phones and other mobile devices need to be protected from such radiation. Automotive circuits, such as microcontrollers that are mounted near the spark plugs also need to be shielded, and the plastic encapsulant does not provide EMI or RFI shielding.

Conventional shielding systems use a conductive metallic enclosure that surrounds the circuit to be shielded. The enclosure protects the internal circuit from EMI and RFI and prevents the escape of RFI or EMI signals generated by the circuit. Another solution is to place a metal cap over a semiconductor device either before or after molding the package. This solution is applicable to ball grid array (BGA) packages that have a large semiconductor die (i.e., at least one inch squared). Yet another solution is to provide a metal coating over the encapsulated device. However, all of these solutions have some drawbacks. For instance, using a conductive metal enclosure adds to the overall size of the package and requires an additional soldering step to attach the metal shield to the device, with the heat generated by the additional soldering process potentially harming the device.

Therefore, a need exists for cost-effective, component level shielding that can be used in a variety of packages with any semiconductor die size.

BRIEF DESCRIPTION OF THE DRAWINGS

Embodiments of the invention will become more fully apparent from the following detailed description, the appended claims, and the accompanying drawings. The drawings are not necessarily to scale, as some elements may be relatively smaller or larger than other elements, with such differences being to highlight the features of the invention. In the drawings, like reference numerals identify similar or identical elements.

DETAILED DESCRIPTION

Figure 2:
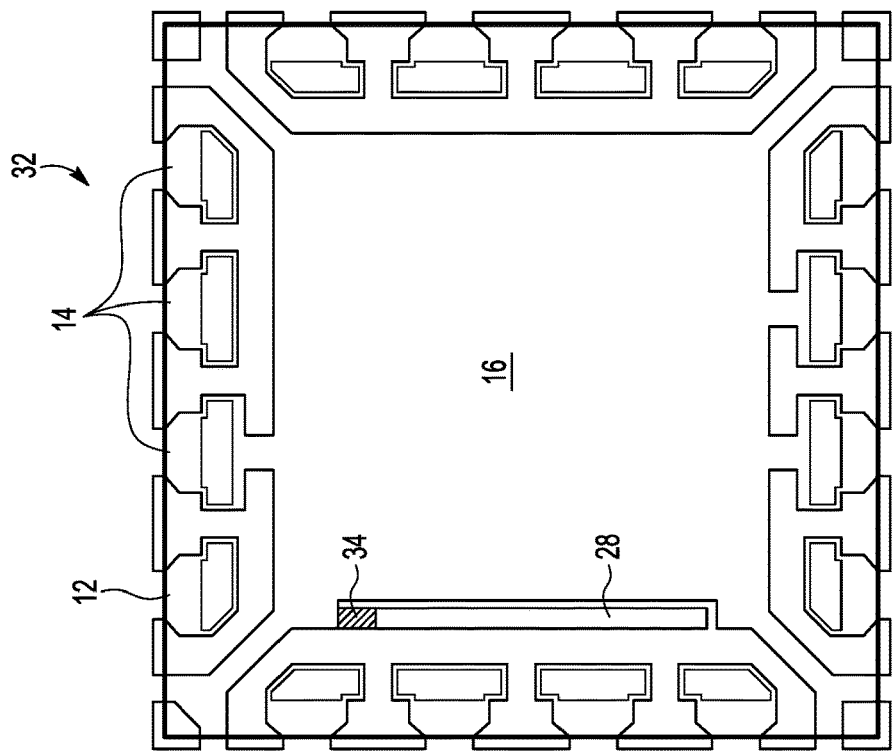
FIG. 2 is a top plan view of a lead frame used to form the semiconductor device of FIG. 1.

Detailed illustrative embodiments of the invention are disclosed herein. However, specific structural and functional details disclosed herein are merely representative for purposes of describing example embodiments of the invention. The invention may be embodied in many alternate forms and should not be construed as limited to only the embodiments set forth herein. The terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

The present invention provides a semiconductor device having a lid that provides EMI and RFI shielding. The device is formed with a lead frame that includes a vertical strip formed in a die pad of the lead frame. The vertical strip contacts and is in electrical communication with the lid. In one embodiment, the present invention is an article of manufacture, including a die receiving area, a plurality of leads disposed on at least one side of the die receiving area and that are generally perpendicular to the at least one side of the die receiving area, and a strip formed in the die receiving area that is bendable to a substantially vertical position for connection to a package lid. Each of the leads has an inner lead end that is spaced from but near to the at least one side of the die receiving area and an outer lead end that is distal to the at least one side of the die receiving area.

The present invention provides a semiconductor device having a lid that provides EMI and RFI shielding. The device is formed with a lead frame that includes a vertical strip formed in a die pad of the lead frame. The vertical strip contacts and is in electrical communication with the lid. In one embodiment, the present invention is an article of manufacture, including a die receiving area, a plurality of leads disposed on at least one side of the die receiving area and that are generally perpendicular to the at least one side of the die receiving area, and a strip formed in the die receiving area that is bendable to a substantially vertical position for connection to a package lid. Each of the leads has an inner lead end that is spaced from but near to the at least one side of the die receiving area and an outer lead end that is distal to the at least one side of the die receiving area.

In another embodiment, the present invention is a shielded semiconductor device, including a lead frame, an integrated circuit (IC) die, an encapsulant, and a lid. The lead frame has a die receiving area, a plurality of leads disposed on at least one side of the die receiving area and that are generally perpendicular to the at least one side of the die receiving area, and a strip formed in the die receiving area that is bent to a substantially vertical position for connection to a package lid. Each of the leads has an inner lead end that is spaced from but near to the at least one side of the die receiving area and an outer lead end that is distal to the at least one side of the die receiving area. The IC die is attached to the die receiving area and electrically connected to the inner lead ends of the plurality of leads. The encapsulant is formed over the first die and the electrical connections between the first die and the plurality of inner lead ends and forms a body. The strip extends vertically to an upper edge of the body. The lid is formed on the upper edge of the body and is in contact with a distal end of the vertical strip.

In yet another embodiment, the present invention provides a method of assembling a shielded semiconductor device. The method includes providing a lead frame including a die receiving area, a plurality of leads disposed on at least one side of the die receiving area and that are generally perpendicular to the at least one side of the die receiving area, and a strip formed in the die receiving area that is bent to a substantially vertical position for connection to a package lid. Each of the leads has an inner lead end that is spaced from but near to the at least one side of the die receiving area and an outer lead end that is distal to the at least one side of the die receiving area. The method also includes attaching an IC die to the die pad of the lead frame, electrically connecting the IC die to the inner lead ends of the plurality of leads, and encapsulating the IC die, the electrical connections and the lead frame with a molding compound. The molding compound forms a body and the distal ends of the leads are exposed on one or more sides of the body and a distal end of the vertical strip is exposed on a top side of the body. The method also includes forming a metallic lid on the top side of the body. The exposed distal end of the vertical strip contacts the lid.

Figure 1:
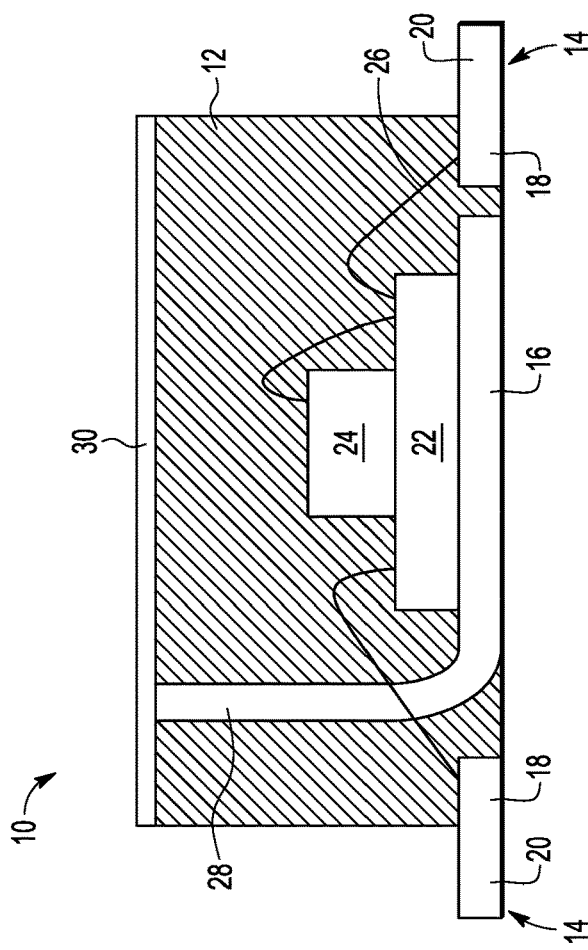
FIG. 1 is an enlarged cross-sectional side view of a semiconductor device in accordance with an embodiment of the present invention.

Referring now to FIG. 1, a cross-sectional side view of a packaged semiconductor device 10 in accordance with an embodiment of the present invention is shown. The semiconductor device 10 has a body 12 formed with a plastic mold compound and a plurality of leads 14 that extend outwardly from the housing 12. The semiconductor device 10 may house various kinds of integrated circuits, such as a power device, an application specific IC (ASIC), etc., and the leads 14, although shown as extending straight out of two opposing sides of the device 10, may extend from one, two, three, or even all four sides of the device 10. Moreover, the leads 14 may be bent into different shapes, such as J-leads or Gull Wing leads, or be even with the housing, thereby forming a QFN (Quad Flat No-Lead) device.

The device 10 is a lead frame-based device, where the lead frame includes the leads 14 and a die receiving area 16. The leads 14 generally extend perpendicularly away from the sides of the die receiving area 16. Each lead 14 thus has an inner lead end 18 that is spaced from but near to the side of the die receiving area 16 and an outer lead end 20 that is distal to the side of the die receiving area 16, and as discussed above, the distal ends 20 of the leads 14 may extend outwardly from the lateral sides of the device 10.

The die receiving area 16 is sized and shaped to support one or more semiconductor integrated circuit (IC) dies. In the embodiment shown, a first IC die 22 is attached to a top surface of the die receiving area 16 and a second IC die 24 is stacked on top of the first IC die 22. The second IC die 24 is optional and may be located adjacent to the first IC die 22. Furthermore, there could be one or more stacked dies and one or more adjacent dies. The first IC die 22 is electrically connected to the leads 14 with bond wires 26 that are connected at one end to a bonding pad on an active surface of the first IC die 22 and at the other end to the inner lead ends 18 of the leads 14. The second IC die 24 is attached to the top surface of the first IC die 22 using conventional methods and electrically connected to one or both the first IC die 22 and one or more of the leads 14 also using bond wires 26.

A key feature of the invention is a bendable strip 28 that is bent to extend vertically from the die receiving area 16 to a top surface of the body 12. The device 10 also includes a lid 30 that is formed over the top surface of the body 12. The vertically bendable strip 28 then extends to and is connected with the lid 30. In one embodiment, the lid 30 comprises a metal, e.g., Copper, that is sputter coated onto the top surface of the body 12. If necessary, the body 12 may be subjected to grinding to expose the strip 28 so that when the lid 30 is formed on the top surface of the body 12, the strip 28 will contact the lid 30. Although in the presently preferred embodiment the lid 30 is sputter-coated onto the top surface of the body 12, a preformed lid may be attached to the top surface of the body 12 using an adhesive. Further, the lid 30 may extend at least partially over the sides of the body 12.

FIG. 2 is a top plan view of a lead frame 32 in accordance with an embodiment of the present invention is shown. The lead frame 32 preferably is formed from a copper sheet by punching, stamping, cutting or etching, as is known in the art, and the underlying metal (e.g., Cu), may be plated with one or more other metals or an alloy, such as Ni, Pd, and Au. The lead frame 32 includes the leads 14, the die receiving area 16, and the bendable strip 28.

In the presently preferred embodiment, the strip 28 is formed along one side of the die receiving area 16 and includes a joint 34 from which the strip 28 may be bent to the vertical position. The joint 34 may be formed by etching and progressive mechanical forming or upset tool. The length of the strip 28 is sized to the height of the body 12. In one embodiment, the strip 28 has a width of about 0.050 mm to about 0.200 mm, and a length of about 0.50 mm to about 2.0 mm. However, it will be understood by those of skill in the art that the strip 28 may be formed in other locations of the lead frame, and that the dimensions of the strip will be influenced by the size of the package, the size of the die receiving area, and the size of the die(s) attached to the die receiving area.

The die receiving area 16 may be rectangular and the leads 14 are disposed on each of the sides of the die receiving area and extend perpendicularly away from the respective sides of the die receiving area 16, as is known in the art. The inner lead ends 18 of the leads 14 are spaced from, but near to the respective sides of the die receiving area 16.

FIG. 2 also shows the outline of the body 12, or rather where in one embodiment, the body 12 is located. However, it will be understood by those of skill in the art that the size of the body may be slightly larger or smaller depending on the sizes of the components covered by the body and how much of the outer lead ends 20 is desired to extend outwardly from the body 12.

Figure 3:
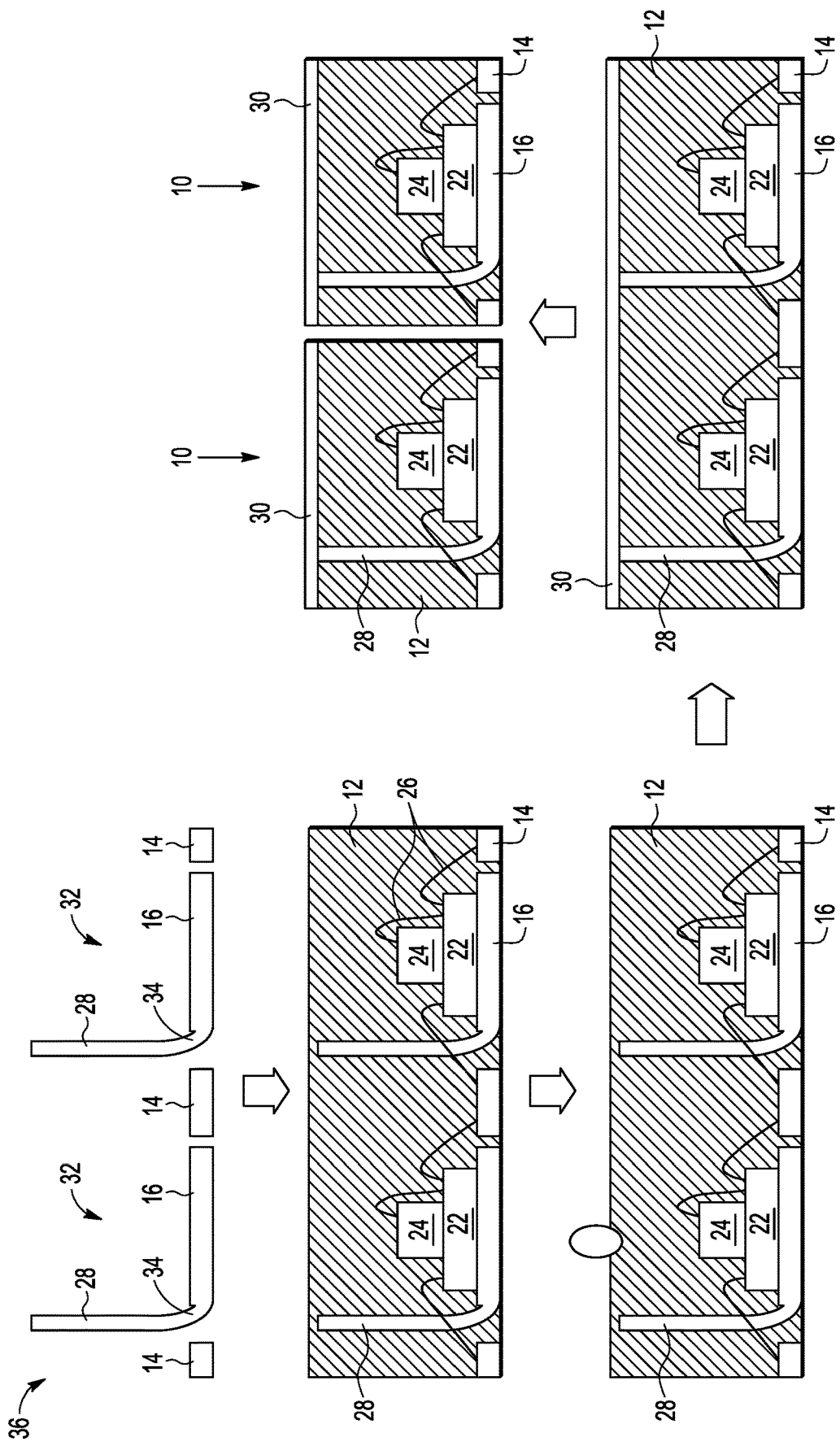
FIG. 3 is a series of cross-sectional side views illustrating a method of assembling the semiconductor device of FIG. 1.

FIG. 3 is a series of figures illustrating the assembly of the semiconductor device 10 shown in FIG. 1. Starting at the upper left side, a portion of a lead frame sheet 36 including a plurality of the lead frames 32 is shown. Each of the lead frames 32 includes leads 14, die receiving area 16, and the bendable strip 28, which has been bent to a vertical position by bending the strip 28 at the joint 34.

In the middle figure on the left side, first dies 22 have been attached to the die receiving areas 16 and second dies 24 have been attached to the upper surfaces of the first dies 22. Each of the first and second dies 22 and 24 also has been electrically connected to the leads 14 with bond wires 26. The first die 22 may be attached to the die receiving area 16 using known die attach methods, including solder, glue, or tape, and the second die 24 may be attached to the surface of the first die 22 also using known methods. In the embodiment shown, bond wires 26 are used to electrically connect the bonding pads (not shown) on an active surface of the first die 22 to the inner lead ends 18, and to connect bond pads of the second die 24 to either or both of selected ones of the bond pads of the first die 22 and the inner lead ends 14. Alternatively, if the first die is a flip-chip die, then the first die could rest atop the leads with the die bonding pads directly connected to the inner leads ends, such as with conductive bumps or balls. Further, a molding process has been performed to cover the dies 22 and 24 and bond wires 26 with a molding compound to form the body 12.

In the lower figure on the left side, the top surface of the package body (i.e., the mold compound) is subjected to grinding to expose the strip 28. Then, as shown in the lower right-side drawing, the lid 30 is formed on the top surface of the body 12, with the lid 30 contacting the exposed portion of the strip 28. As previously noted, the lid 30 preferably is formed by sputtering a layer of Copper on the top surface of the body 12. Finally, in the top right side, individual devices 10 are formed by singulating the simultaneously formed devices.

As will be understood by those of skill in the art, trim and form processes also are performed in which outer portions of the lead frames 32 are cut away and the outer lead ends 20 of the leads 14 extend beyond an outer edge of the body 12, thereby providing the packaged semiconductor device 10. The outer lead ends 20 may or may not extend beyond the outer edge of the body 12 depending on design requirements and may be bent into desired shapes such as Gull Wing and J-leads.

Figure 4:
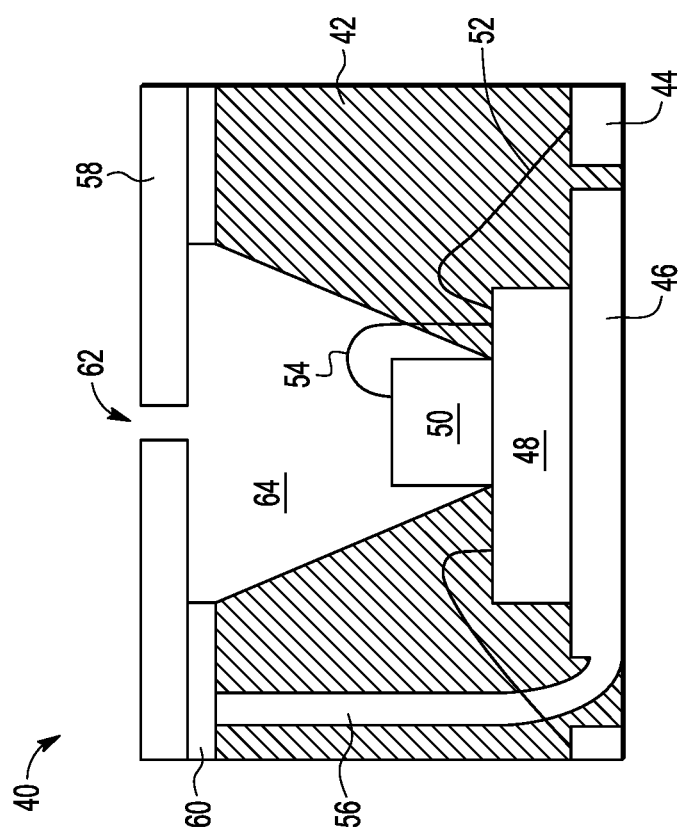
FIG. 4 is an enlarged cross-sectional side view of a pressure sensor semiconductor device in accordance with an embodiment of the present invention.

Referring now to FIG. 4, a cross-sectional side view of a packaged semiconductor device 40 in accordance with another embodiment of the present invention is shown. The semiconductor device 10 has a body 42 formed with a plastic mold compound and a plurality of leads 44 that are exposed at the sides and bottom of the housing 42, such that the device 40 is a QFN type package. There is a die receiving area 46 and a microcontroller die 48 attached to a surface of the die receiving area 46. The die receiving area 46 comprises a lead frame flag. A pressure sensor die 50 is attached to a top surface of the microcontroller die 48. The microcontroller die 48 is electrically connected to the leads 44 with the first bond wires 52 and the pressure sensor die 50 is electrically connected with the microcontroller die 48 with second bond wires 54.

There is a bendable strip 56 that extends from the die receiving area 46 vertically to a top of the body 42. A lid 58 is secured to the top surface of the body 42 with a conductive glue 60. The lid 58 includes a hole 62, and the body 42 includes a void 64. The void 64 is formed over the pressure sensor die 50 during molding. The hole 62 in the lid 58 is in fluid communication with the void 64 such that the top surface of the pressure sensor die 50 is exposed to the ambient environment. In one embodiment, a gel (not shown) at least partially fills the void and covers the pressure sensor die 50.

As will now be apparent, the present invention provides a packaged semiconductor device that has a bendable strip that extends vertically from a die receiving area to a lid formed on a top surface of the package. The strip being connected to the lid provides EMI and RFI shielding. The bendable strip is part of a lead frame. The lead frame thus includes a bendable joint for bending the strip to the vertical position. The lead frame may be fabricated by a lead frame supplier and the lead frame supplier may supply the lead frame with the strip either in a flat position or already bent and in a vertical position.

Unless explicitly stated otherwise, each numerical value and range should be interpreted as being approximate as if the word "about" or "approximately" preceded the value or range. Also, although labels such as top and bottom have been used, it is understood that such are relative terms, so such surfaces or orientations are not absolute. Furthermore, although stacked die devices are shown and described, the invention is not limited to stacked die devices, as a single die device, a device with side-by-side dies, or a device with a combination of stacked dies and side-by-side dies may be assembled that include a vertical strip that extends to and is connected with a package lid.

It will be further understood that various changes in the details, materials, and arrangements of the parts that have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The invention claimed is:

1. An article of manufacture, comprising:
   a lead frame, wherein the lead frame includes a die receiving area, a plurality of leads disposed on at least one side of the die receiving area and that are generally perpendicular to the at least one side of the die receiving area, wherein each lead of the plurality of leads has an inner lead end that is spaced from but near to the at least one side of the die receiving area and an outer lead end that is distal to the at least one side of the die receiving area, and a strip formed in the die receiving area that is bendable to a substantially vertical position for electrical connection to a package lid, and wherein the die receiving area, the plurality of leads, and the strip are all formed of the same electrically conductive sheet material.

2. The article of claim 1, wherein the strip is formed along one side of the die receiving area.

3. The article of claim 1, wherein the strip has a width of 0.05 mm to 0.20 mm, and a length of 0.50 mm to 2.0 mm.

4. The article of claim 1, wherein the lead frame is formed from a copper sheet that is plated with a non-corrosive metal or metal alloy.

5. The article of claim 1, wherein the die receiving area is rectangular.

6. The article of claim 5, wherein the plurality of leads includes leads disposed on each of the sides of the die receiving area.

7. The article of claim 1, further comprising:
   a first integrated circuit die attached to the die receiving area and electrically connected to the inner lead ends of the plurality of leads; and an encapsulant formed over the first die, the electrical connections between the first die and the plurality of inner lead ends, wherein the encapsulant forms a body, and wherein the strip is bent vertically and extends to an upper edge of the body.

8. The article of claim 7, further comprising the package lid formed on the upper edge of the body and in contact with the strip.

9. The article of claim 8, wherein the package lid comprises a metal sputter coated on the top edge of the body.

10. The article of claim 7, wherein the first die is electrically connected to the inner lead ends with bond wires.

11. The article of claim 10, further comprising a second integrated circuit die attached to a top surface of the first die and electrically connected to at least one of the first die and the plurality of leads.

12. The article of claim 11, wherein the first die comprises a microcontroller unit and the second die comprises a pressure sensor, wherein there is a void in the encapsulant above the second die and a hole in the package lid that is in communication with the void such that the second die is exposed to the ambient environment outside of the body by way of the hole and the void.

13. The article of claim 12, wherein the package lid is attached to the upper edge of the body with a conductive adhesive and the vertical strip is in contact with the conductive adhesive.

14. A shielded semiconductor device comprising:
a lead frame including a die receiving area, a plurality of leads disposed on at least one side of the die receiving area and that are generally perpendicular to the at least one side of the die receiving area, wherein each lead of the plurality of leads has an inner lead end that is spaced from but near to the at least one side of the die receiving area and an outer lead end that is distal to the at least one side of the die receiving area, and a strip formed in the die receiving area that is bent to a substantially vertical position, and wherein the die receiving area, the plurality of leads, and the strip are all formed of the same electrically conductive sheet material;
a first integrated circuit die attached to the die receiving area and electrically connected to the inner lead ends of the plurality of leads;
an encapsulant formed over the first die and the electrical connections between the first die and the plurality of inner lead ends, wherein the encapsulant forms a body, and wherein the strip extends vertically to an upper edge of the body; and
a package lid formed on the upper edge of the body and in contact with a distal end of the vertical strip such that the vertical strip is in electrical communication with the package lid.

15. The shielded semiconductor device of claim 14, further comprising a second integrated circuit die attached to a top surface of the first die and electrically connected to at least one of the plurality of leads and the first die, and covered with the encapsulant.

16. A method of assembling a shielded semiconductor device, comprising:
providing a lead frame including a die receiving area, a plurality of leads disposed on at least one side of the die receiving area and that are generally perpendicular to the at least one side of the die receiving area, wherein each lead of the plurality of leads has an inner lead end that is spaced from but near to the at least one side of the die receiving area and an outer lead end that is distal to the at least one side of the die receiving area, and a strip formed in the die receiving area that is bent to a substantially vertical position for electrical connection to a package lid, and wherein the die receiving area, the plurality of leads, and the strip are all formed of the same electrically conductive sheet material;
attaching a first integrated circuit (IC) die to the die receiving area of the lead frame;
electrically connecting the first IC die to the inner lead ends of the plurality of leads;
encapsulating the first IC die, the electrical connections and the lead frame with a molding compound, wherein the molding compound forms a body and wherein the distal ends of the plurality of leads are exposed along at least one lateral side of the body and a distal end of the vertical strip is exposed at a top surface of the body; and
forming a metallic lid on the top surface of the body, wherein the exposed distal end of the vertical strip contacts the package lid such that the vertical strip is in electrical communication with the package lid.

17. The method of claim 16, further comprising:
attaching a second IC die to an upper surface of the first IC die and electrically connecting the second IC die to at least one of the first IC die and the inner lead ends of the plurality of leads, wherein the second IC die is covered with the molding compound.

18. The method of claim 17, wherein a void is formed over the second IC die and the package lid includes a hole that is in communication with the void such that the second IC die is exposed to the ambient environment by way of the hole and the void.

19. The method of claim 18, wherein the first IC die is a microcontroller unit and the second IC die is a pressure sensor.

20. The method of claim 16, wherein the lid is formed by sputtering.

* * * * *